United States Patent
Gossner

(10) Patent No.: US 6,441,437 B1
(45) Date of Patent: Aug. 27, 2002

(54) INTEGRATED SEMICONDUCTOR CIRCUIT WITH PROTECTIVE STRUCTURE FOR PROTECTION AGAINST ELECTROSTATIC DISCHARGE

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/538,798

(22) Filed: Mar. 30, 2000

Related U.S. Application Data

(63) Continuation of application No. PCT/DE98/02880, filed on Sep. 29, 1998.

(30) Foreign Application Priority Data

Sep. 30, 1997 (DE) .......................................... 197 43 232

(51) Int. Cl.[7] .............................................. H01L 23/62
(52) U.S. Cl. ....................... 257/355; 257/355; 257/358; 257/360; 257/361
(58) Field of Search ................................ 257/351, 358, 257/361, 273, 378, 173, 357, 360, 362, 379, 555, 355, 546, 544

(56) References Cited

U.S. PATENT DOCUMENTS

| | | | | |
|---|---|---|---|---|
| 5,463,239 A | * | 10/1995 | Mühlemann | ................ 257/355 |
| 5,571,394 A | * | 11/1996 | Ker et al. | .................... 257/357 |
| 5,572,394 A | * | 11/1996 | Ker et al. | ...................... 361/56 |
| 5,602,409 A | * | 2/1997 | Olney | ......................... 257/362 |

FOREIGN PATENT DOCUMENTS

| | | | |
|---|---|---|---|
| DE | 0492032 A1 | * | 7/1992 |
| EP | 0 414 934 A1 | * | 3/1991 |
| EP | 0 623 958 A1 | * | 11/1994 |
| EP | 0 768 713 A2 | * | 4/1997 |
| EP | 0 785 576 A2 | * | 4/1997 |
| JP | 58 074 081 | * | 5/1983 |
| JP | 61 056 458 | | 3/1986 |
| JP | 61190973 | * | 8/1986 |

OTHER PUBLICATIONS

Kokosa et al., A High–Voltage, High–Temperature Reverse Conducting Thyristor, Sep. 1970, IEEE Transactions on Electron Devices, vol. ED–17, No. 9, p. 669.*

* cited by examiner

Primary Examiner—Olik Chaudhuri
Assistant Examiner—Dilinh Nguyen
(74) Attorney, Agent, or Firm—Laurence A. Greenberg; Werner H. Stemer; Ralph E. Locher

(57) ABSTRACT

An integrated semiconductor circuit includes a protective structure for protection against electrostatic discharge. The protective structure is disposed between a terminal pad and the integrated semiconductor circuit and is connected to at least one busbar. The protective structure includes transistors of different types with reciprocal coupling of the collector terminals and base terminals to form a thyristor structure. Integrated vertical npn switching transistors are used as protective elements, the bases of which are driven by integrated pnp driving transistors. The gain factor of the driving transistors is small enough to avoid the triggering of the parasitic thyristor with undesirable snapback of the high current characteristic curve at the sustaining voltage. A buried layer having partial regions with a higher doping concentration than regions of the buried layer outside the partial regions. The buried layer has a very low resistance, which results in homogenization of the current flow in the event of breakdown. The turn-on voltage of the active protective element is additionally set by suitable selection of the base width of the driving transistors.

20 Claims, 5 Drawing Sheets

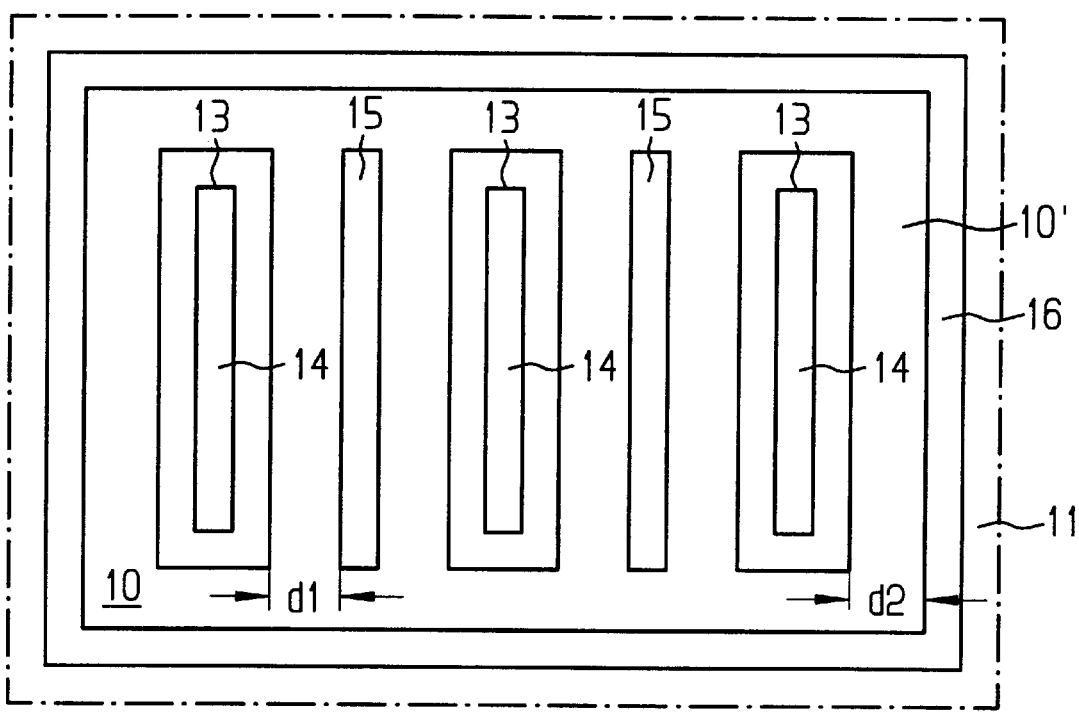

INTEGRATED SEMICONDUCTOR CIRCUIT WITH PROTECTIVE STRUCTURE FOR PROTECTION AGAINST ELECTROSTATIC DISCHARGE

CROSS-REFERENCE TO RELATED APPLICATION

This is a continuation of copending International Application PCT/DE98/02880, filed Sep. 29, 1998, which designated the United States.

BACKGROUND OF THE INVENTION

FILED OF THE INVENTION

The invention lies in the field of semiconductors. The invention relates to an integrated semiconductor circuit with a protective structure for protection against electrostatic discharge.

Semiconductor circuits integrated in a chip contain protective circuits for protecting the inputs or outputs (I/O ports) against electrostatic overvoltages and electrostatic discharges (ESD). The ESD protective elements are connected between the input pad of an integrated semiconductor circuit and the input or output terminal to be protected. Consequently, the ESD protective elements ensure that when a parasitic overvoltage is coupled, the in ESD element is turned on and the parasitic overvoltage pulse is conducted away to one of the supply voltage conductive tracks. Such overvoltage pulses can lead, in the extreme case, to the destruction of the component. An ESD protective element is disclosed in European Patent Application 0 414 934 A1.

Under operating conditions described, for example, in a product specification, the ESD protective elements must not adversely affect the function of the integrated semiconductor circuits to be protected. In other words, the turn-on voltage of the ESD protective elements must lie outside the signal voltage range of the protected terminal pads. In order to develop a good protective action, the ESD protective element should break down before the most critical circuit path. As a rule, proper break down requires an exact setting of the turn-on voltage of the respective ESD protective elements with the essential boundary condition that the process control (which has been optimized with regard to the properties of the components of the integrated semiconductor circuit to be protected) is not altered by the insertion of the ESD protective elements.

A further essential boundary condition results from the spatial configuration of the terminal pads in immediate proximity to the integrated semiconductor circuit to be protected. In particular, the terminal pads are disposed in the vicinity of the output drives due to the relatively high currents to be driven. The ESD protective structure is, therefore, frequently connected to that supply line from which the output driver is supplied.

What is essential to the functioning of generic type ESD protective elements is the capability of allowing short high-current pulses right into the ampere range to be conducted away without the ESD element being damaged by the high-current pulses. The protective elements are operated in the event of breakdown during the ESD pulse. Because the protective elements have to be provided at all supply and signal terminals, they must be configured to be as compact and space-saving as possible. At the same time, the current to be conducted away must be distributed as uniformly as possible over the entire breakdown path. Uniform distribution obtains the highest possible total current through the protective element and, hence, a high ESD strength up to a critical current density that can lead to damage to the protective element (second breakdown).

Particularly, in the case of protective elements having a snapback behavior of the characteristic curve in the event of breakdown (e.g. bipolar transistors or thyristors), there is a risk that a location on the breakdown path or a finger of a multifinger structure triggers and conducts away the current without the remaining regions of the breakdown structure or the remaining fingers turning on. The protective elements and the integrated circuits to be protected that are connected downstream are often destroyed as a result of the effect.

Occasionally, very large potential differences in the base zone of the protective elements are the cause of such an inhomogeneous turn-on. These potential differences result from the very high sheet resistance of the base and the high currents to be conducted away. As a rule, an improvement can be obtained only by a suitable metallic interconnection of the base regions, in particular, finger structures. However, such interconnection requires contact to be made with the base regions, such contact being associated with a high outlay in terms of area. Moreover, the degree of homogenization that can be attained will differ greatly depending on configuration stipulations and technological parameters.

With regard to further details, features, advantages and method of operation of the ESD protective circuits, European Patent Applications 0 623 958 A1 and 0 414 934 A1 are incorporated by reference.

SUMMARY OF THE INVENTION

It is accordingly an object of the invention to provide an integrated semiconductor circuit with a protective structure for protection against electrostatic discharge that overcomes the hereinafore-mentioned disadvantages of the heretofore-known devices of this general type and that provides an ESD protective structure that has a distinctly improved homogenization of the current flow in the event of breakdown.

With the foregoing and other objects in view, there is provided, in accordance with the invention, in a semiconductor assembly having at least one semiconductor body, an integrated semiconductor circuit disposed in the at least one semiconductor body, an electrically conductive connecting line, at least one terminal pad connected to the integrated semiconductor circuit through the connecting line, at least one first busbar carrying a first supply potential of the integrated semiconductor circuit during operation, at least one second busbar carrying a second supply potential of the integrated semiconductor circuit during operation, and a protector for protecting the integrated semiconductor circuit against electrostatic discharge, the protector disposed between the at least one terminal pad and the integrated semiconductor circuit and connected to at least one of the at least one first busbar and the at least one second busbar, the protector including at least one protective element having first transistors each having a base terminal, a collector terminal, and majority charge carriers of a first conduction type, second transistors each having a base terminal, a collector terminal, and majority charge carriers of a second conduction type, the first transistors and the second transistors respectively connected by reciprocal coupling of at least one of the base terminals and the collector terminals to form a thyristor structure, at least one first integrated resistor with a lowest possible resistance driving the base terminals of the second transistors and the collector terminals of the first transistors, and a buried layer having partial regions with a higher doping concentration than regions of the buried layer outside the partial regions.

Integrated vertical switching transistors are utilized as ESD protective elements. The bases of the switching transistors are driven by integrated driving transistors. Essentially, the current gain (base-collector gain) of the driving transistors is small enough to avoid the triggering of the parasitic thyristor—which results from the wiring of the switching transistors and of the driving transistors—with an undesirable snapback of the high-current characteristic curve at the sustaining voltage. The turn-on voltage of the ESD protective element can be established advantageously by a suitable selection of the base widths of the driving transistors.

A buried layer configured to have the lowest possible resistance is essential to the invention. The sheet resistance of the buried layer defines an integrated resistor that is disposed between the base terminals of the driving transistors and the collector terminals of the switching transistors, and which enables homogenization of the current flow in the event of breakdown.

In accordance with another feature of the invention, the partial regions are disposed next to one another and/or are spaced apart from one another in the buried layer.

In accordance with an additional feature of the invention, there is provided a further partial region having at least one base zone, at least one first emitter zone, and at least one second emitter zone, and wherein the at least one protective element is disposed in the further partial region, the first transistors are switching transistors, the second transistors are driving transistors, the at least one base zone is a well, has the first conduction type, and forms the base terminals of the switching transistors and the collector terminals of the driving transistors, the at least one first emitter zone is a well, has the second conduction type, is disposed in the at least one base zone and forms the emitter terminals of the switching transistors, and the at least one second emitter zone is a well, has the first conduction type, is spaced apart from the at least one base zone by a first distance, and forms the emitter terminals of the driving transistors.

In accordance with yet another feature of the invention, the at least one first emitter zone forms the emitter terminals of every one of the switching transistors.

In accordance with yet a further feature of the invention, the buried layer is at least one buried layer, and the at least one buried layer has the second conduction type and the first integrated resistor and forms the collector terminals of the first transistors and the base terminals of the second transistors.

In accordance with yet an added feature of the invention, the at least one buried layer has a doping concentration, and a conductance of the first integrated resistor is defined by the doping concentration of the at least one buried layer.

In accordance with yet an additional feature of the invention, the first transistors are switching transistors and the second transistors are driving transistors for driving the switching transistors.

In accordance with again another feature of the invention, the switching transistors have a base-collector gain, and the driving transistors have a base-collector gain significantly less than the base-collector gain of the switching transistors.

In accordance with again a further feature of the invention, the second transistors are driving transistors having a base-collector gain defined by the first distance.

The buried layer is connected to the terminal pad through a connection zone, which is doped as heavily as possible for reasons of good conductivity. The connection zone defines a partial region in which are disposed the protective elements. The partial region is typically disposed in an epitaxial layer. It is particularly advantageous if the connection zone is configured as a closed ring around the partial region.

In accordance with again an added feature of the invention, there is provided at least one connection zone connected to the buried layer and to at least one of the at least one first busbar and the at least one second busbar.

In accordance with still another feature of the invention, there are provided connection zones equidistantly spaced from at least one of the at least one base zone and the at least one second emitter zone by a second distance, and connected to the buried layer and to at least one of the at least one first busbar and the at least one second busbar The connection zones are spaced equidistantly from the base zones and/or from the second emitter zones by a second distance. The second distance may typically be chosen to be sufficiently large that the parasitic bipolar transistor in the edge region of the partial zone does not turn on.

In accordance with still a further feature of the invention, the at least one connection zone has a doping concentration, and a second integrated resistor having a conductance set by the doping concentration of the at least one connection zone.

A second integrated resistor, by which it is possible to set the drive sensitivity of the driving transistors, is essentially dependent on the doping concentration in the connection zone. In addition, the second resistor also depends on contact resistances of the electrical connections.

In accordance with still an added feature of the invention, the connection zones have a doping concentration, and a second integrated resistor having a conductance set by the doping concentration of the connection zones.

In accordance with still an additional feature of the invention, the at least one connection zone is a closed ring around the further partial region.

In accordance with yet another feature of the invention, the connection zones form a closed ring around the further partial region.

In accordance with yet a further feature of the invention, the at least one connection zone and the further partial region define a given lateral cross-sectional area, and the buried layer has a lateral cross-sectional area larger than the given lateral cross-sectional area.

In accordance with yet an added feature of the invention, the connection zones and the further partial region define a given lateral cross-sectional area, and the buried layer has a lateral cross-sectional area larger than the given lateral cross-sectional area.

The lateral cross-sectional area of the buried layer is typically larger than the lateral cross-sectional area of the connection zone and of the partial region.

In accordance with yet an additional feature of the invention, the semiconductor body has an epitaxial layer and the further partial region is in the epitaxial layer of the semiconductor body.

The emitter zones typically have a significantly higher doping concentration than the base zones and/or the epitaxial layer. The doping concentration in the epitaxial layer is often defined by the process control for fabricating the integrated circuit.

The buried layer and the connection zones are very heavily doped in order to satisfy the requirements of a very high conductance. Typically, these zones have a doping concentration of more than $1*10^{19}$ cm$^{-3}$.

In accordance with yet another feature of the invention, the at least one first emitter zone has a higher doping concentration than the at least one base zone.

In accordance with a concomitant feature of the invention, the buried layer has a doping concentration greater than $1*10^{19}$ cm$^{-3}$.

The invention is particularly advantageous for use in a semiconductor memory or a logic component. A further advantageous application of the invention is for use in a microcontroller.

The invention is typically integrated in bipolar circuits. The switching transistor may be an npn bipolar transistor and the driving transistor may be a pnp bipolar transistor. It is particularly advantageous, however, if the integrated semiconductor circuit, and also the ESD protective element, are fabricated using CMOS technology, for example, the switching transistor is an n-channel MOSFET and the driving transistor is a p-channel MOSFET transistor.

Other features that are considered as characteristic for the invention are set forth in the appended claims.

Although the invention is illustrated and described herein as embodied in an integrated semiconductor circuit with protective structure for protection against electrostatic discharge, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a plan view of the structure shown in FIG. 2.

DESCRIPTION OF THE PREFERRED EMBODIMENTS

Figure 1:
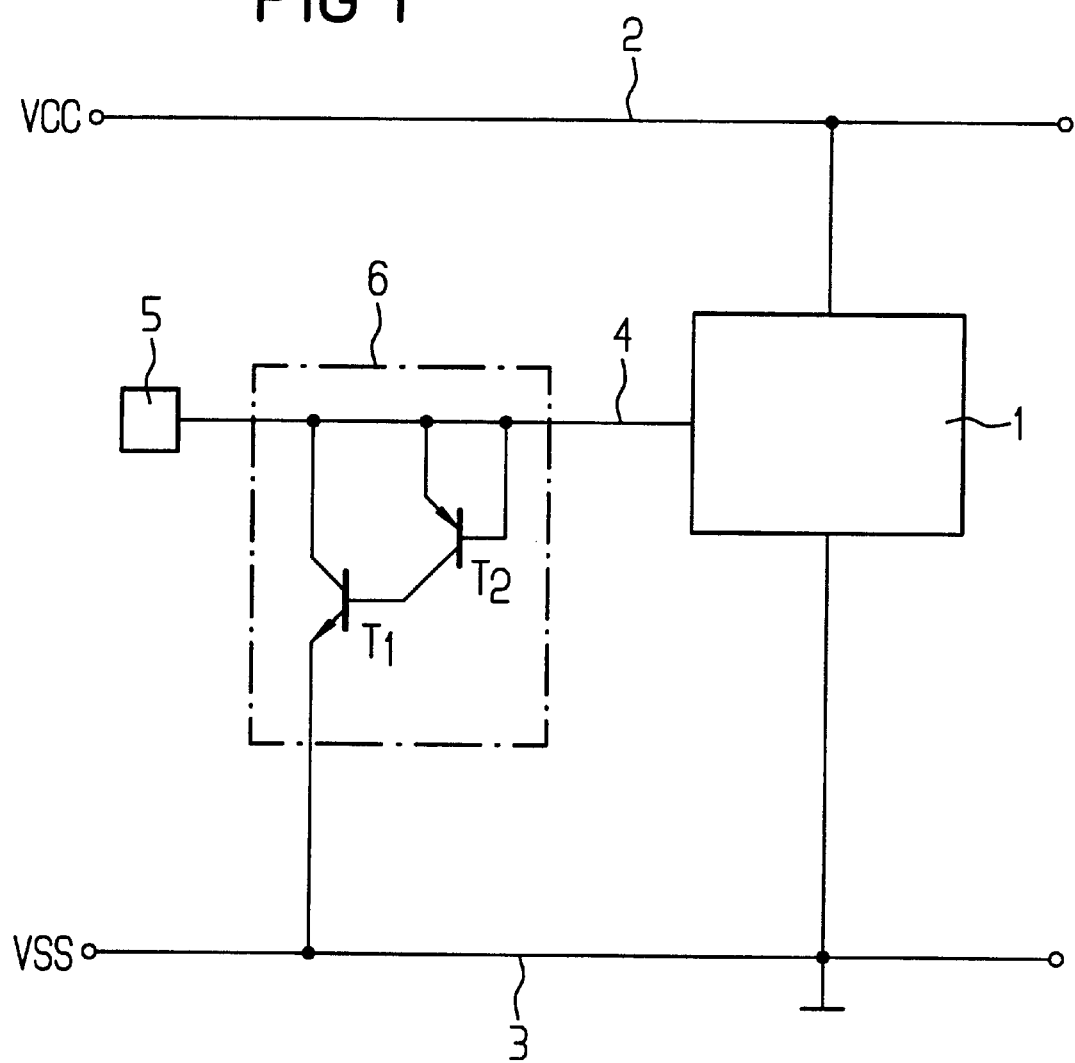
FIG. 1 is a prior art circuit configuration of an integrated semiconductor circuit with an ESD protective element connected upstream.

In all the figures of the drawing, sub-features and integral parts that correspond to one another bear the same reference symbol in each case.

Referring now to the figures of the drawings in detail and first, particularly to FIG. 1 thereof, there is shown a prior art circuit configuration of an integrated semiconductor circuit with an ESD protective element connected upstream.

In FIG. 1, the integrated semiconductor circuit 1 is connected to a first busbar 2 having a first supply potential VCC and also to a second busbar 3 having a second supply potential VSS. The first supply potential VCC may be the supply voltage, for example. The second supply potential VSS may, as in the present example, be the reference ground.

The integrated semiconductor circuit 1 is connected to a terminal pad 5 through a connecting line 4. The terminal pad 5 may be either an input terminal for coupling input signals into the integrated semiconductor circuit 1 or an output terminal for coupling output signals out of the integrated semiconductor circuit 1. These types of terminals are also referred to as I/O ports.

An ESD protective element 6 is connected between the terminal pad 5 and the integrated semiconductor circuit 1. In addition, the ESD protective element 6 is connected to the second busbar 3.

The ESD protective element 6 in FIG. 1 includes a first transistor T1 and a second transistor T2. The transistors T1, T2 are of different types. In the example, the first transistor is an npn transistor and the second transistor is a pnp transistor. The base terminals and the collector terminals of the transistors T1, T2 are reciprocally coupled to form a thyristor structure. The transistors T1, T2 are bipolar transistors in the example. It is also conceivable, to realize the two transistors T1, T2 as MOSFETs, as junction FETs, as thyristors, or as IGBTs that are suitably connected.

In the example, the ESD protective element 6 is connected between the connecting line 4 and the second busbar 3. It is also conceivable for the ESD protective element to be disposed between the connecting line 4 and the first busbar and/or between the connecting line 4 and both busbars 2, 3.

The ESD protective element 6 is intended to protect the integrated semiconductor circuit 1 against parasitic interference signals coupled in through the terminal pad 5. These parasitic interference signals are conducted away by the ESD protective element 6 to one of the busbars 2, 3 and, consequently, do not pass into the integrated semiconductor circuit 1.

These types of interference signals can arise, for example, during transportation and/or during handling of the semiconductor chip, where the semiconductor chip can be electrostatically charged. If the electrostatic charge is coupled into the integrated semiconductor circuit 1, in the extreme case, the coupling leads to the destruction of the integrated semiconductor circuit 1.

In order to simulate the coupling in of an interference signal, the human body model (HBM) is typically used. The equivalent circuit diagram of the human body model provides a low-pass filter, including a capacitance of 100 pF and a resistance of 1.5 KΩ. The human body model simulates an interference signal coupled in by a human. It is also conceivable to use other models such as, for example, the charged device model (CDM).

Figure 2:
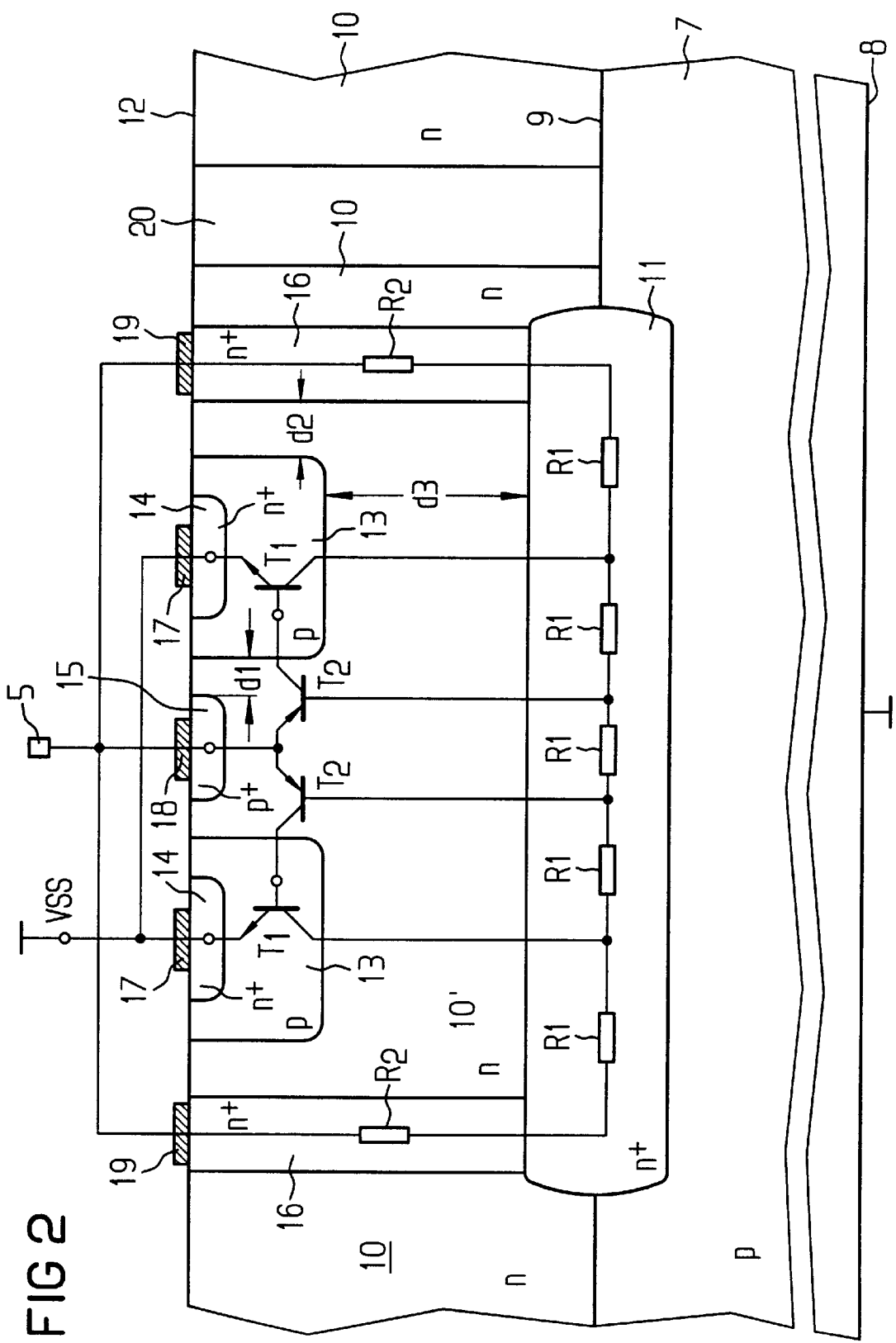
FIG. 2 is a partial cross-sectional view through a first exemplary embodiment of an ESD protective structure according to the invention in a semiconductor system with a superimposed equivalent circuit diagram.

FIG. 2 shows a partial cross-section through a first exemplary embodiment of an ESD protective element according to the invention that, in the present example, is formed by two bipolar transistors connected to form a thyristor structure.

The semiconductor body 7 typically is a silicon substrate having a wafer rear side 8 and a substrate surface 9. The wafer rear side 8 may, for example, be at the reference-ground potential through a customary large-area metallization layer. In FIG. 2, the silicon substrate of the semiconductor body 7 is p-doped and the wafer rear side 8 is at the potential of the reference ground. It is also conceivable for the semiconductor substrate to be n-doped.

A weakly n-doped epitaxial layer 10 is applied on the substrate surface 9 of the semiconductor body 7. For the function of the ESD protective structure, it is also conceivable to dispose a plurality of epitaxial layers 10 one above the other, or to dispense with the epitaxial layer 10 entirely. The doping concentration in the epitaxial layer 10 is defined by the process control for fabricating the integrated semiconductor circuit 1. Typically, the epitaxial layer has a doping concentration of $1*10^{15}$ cm$^{-3}$ to $1*10^{18}$ cm$^{-3}$.

In addition, an n+-doped buried layer 11 is provided. The buried layer 11 can be produced, for example, by introduction of a deposit on the substrate surface 9 prior to growth of the epitaxial layer 10, and subsequent diffusion at a suitable temperature. However, it also advantageous if the buried layer 11 is produced by ion implantation into the semiconductor body 7 after the growth or during the growth of the epitaxial layer 10. In order to obtain the desired vertical profile, multiple implantations at suitable energies and doping doses is frequently necessary. The implantations should be followed by a heat-treatment step for homogeneous distribution of the doping atoms in the diffusion region 9.

The doping concentration in the buried layer 11 is likewise often predetermined by the process control in the course of fabricating the integrated circuit 1. What is essential to the invention, however, is that the buried layer 11 is configured to have the lowest possible resistance. Due to such resistance, the buried layer 16 typically has a doping concentration of greater than $10^{19}$ cm$^{-3}$. The thickness of the epitaxial layer 10 varies between 1 $\mu$m and 10 $\mu$m, depending on the technology.

The buried layer 11 is connected through connection zones 16 to the wafer front side 12 of the semiconductor body 1. The connection zone 16 is of the same conduction type as the buried layer 11 and has an extremely high doping concentration of greater than $1*10^{19}$ cm$^{-3}$. In FIG. 2, the connection zone 16 extends from the wafer surface 12 into the semiconductor body 7 and is connected to the buried layer 11. The connection zones 16 are constructed as a deep implantation layer, but can also be constructed as trenches using conventional trench technology.

In a non-illustrated plan view, the connection zones 16 describe a ring-shaped structure. However, the ring-shaped structure need not necessarily be closed. The ring-shaped structure of the connection zone 16 may be of circular, rectangular, or polygonal construction. The buried layer 11, on one hand, and the connection zones 16, on the other hand, encompass a partial region 10' of the epitaxial layer 10.

Two base zones 13 are disposed at the wafer surface 12 in the partial region 10'. In the exemplary embodiment, the base zones 13 are p-doped and configured as wells. In addition, first emitter zones 14 in the form of wells and of the opposite conduction type are disposed at the wafer surface 12 within the base zones 13. The first emitter zones 14 are centrally configured in the base zones 13 and, in the example, have a very high doping concentration. Second emitter zones 15 are provided between neighboring base zones 13. The second emitter zones 15 are p+-doped and are likewise disposed as wells at the wafer surface 12. It is also conceivable to configure the second emitter zones 15 between base zone 13 and connection zone 16.

The first and second emitter zones 14, 15 typically have a doping concentration of $5*10^{19}$ cm$^{-3}$. The implantation profile of the emitter zone wells projects about 1 $\mu$m into the semiconductor body 7. The base zone 13 has a typical doping concentration of $10^{16}$ cm$^{-3}$ to $10^{17}$ cm$^{-3}$, and the base zone well depth is approximately 2.5 $\mu$m. The above mentioned values are typical of smart power technology (SPT) components. In radio frequency applications, these values lie in the submicron range.

Figure 3:
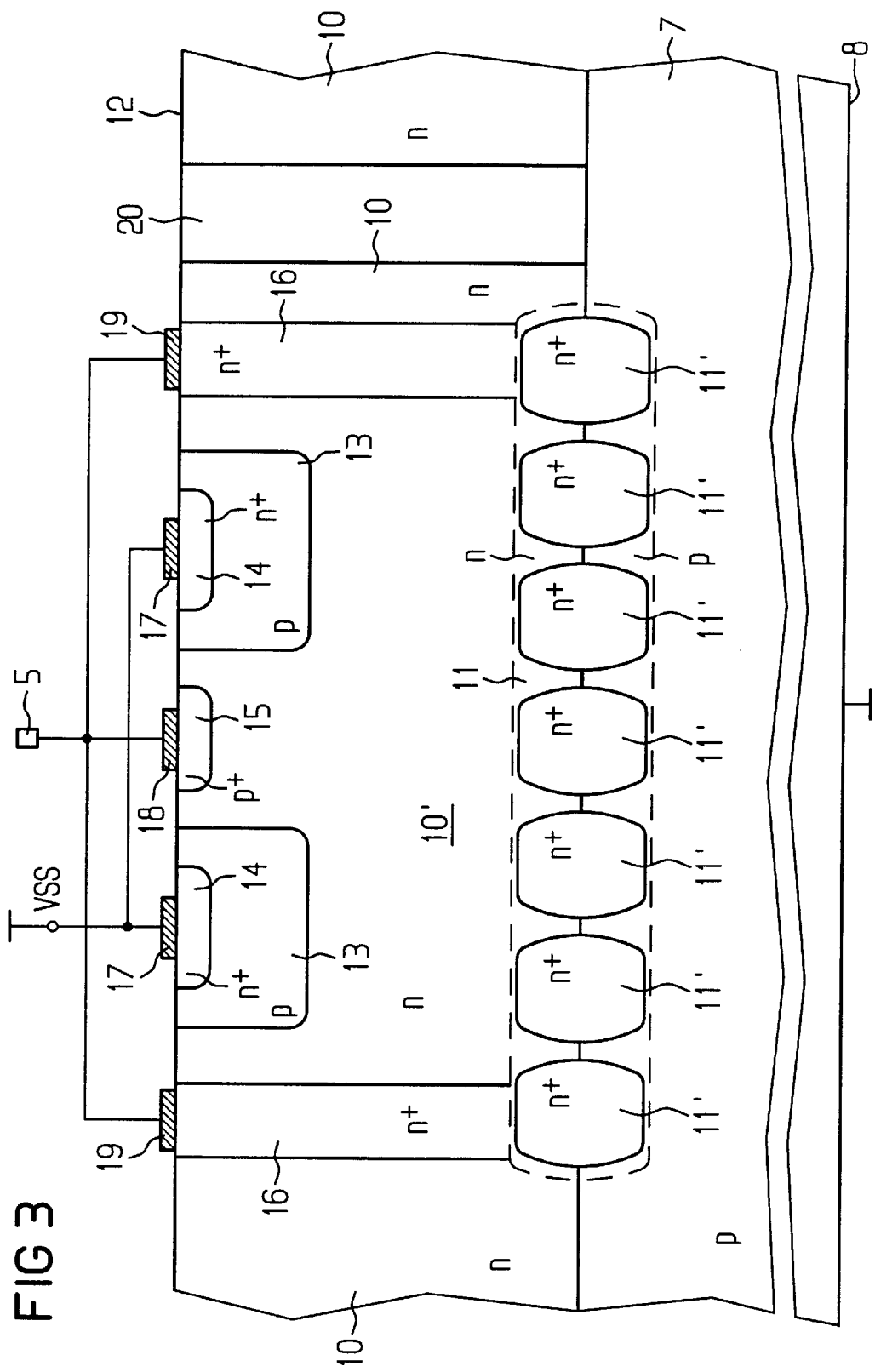
FIG. 3 is a partial cross-sectional view through a second exemplary embodiment of an ESD protective structure according to the invention.

The base zones 13 and the second emitter zones are disposed in a finger structure in the partial region 10' in accordance with FIG. 3. A meandering, concentric or similar structure is also conceivable. The finger structure advantageously has a multiplicity of base zones 13 and a multiplicity of second emitter zones 15. For clarity, however, only two base zones 13 and one second emitter zone 15 are illustrated in FIG. 2.

The distance between the base zones 13 and the second emitter zones 15 is characterized by a first distance d1. The first distance d1 describes the base width of the driving transistors T2. The gain of the driving transistors T2 can be established by the base width and, consequently, by the first distance d1. Typically, the first distance d1 is greater than 20 $\mu$m in SPT technology, and about 2 $\mu$m in radio frequency applications.

The base zones 13 and the second emitter zones 15 are disposed in the partial region 10' spaced apart from the connection zone 16 by a second distance d2. The second distance d2 can be chosen to be large enough that the lateral, parasitic npn bipolar transistor in the edge region of the partial region 10' is suppressed.

The base zones 13 containing the first emitter zones 14, and the second emitter zones 15 are vertically disposed in the epitaxial layer 10 directly above the buried layer 11. They are also spaced apart from the buried layer 11.

The doping concentration of the epitaxial layer 10 and the third distance d3 between buried layer 11 and base zones 13 specify the turn-on voltage of the switching transistors T1.

The base zones 13 and the emitter zones 14, 15 are configured as wells in the example. However, V-shaped, U-shaped, trench, or similar structures are also conceivable. The zones 13, 14, 15 are advantageously introduced by diffusion or by ion implantation into the semiconductor body 7. However, an alternative fabrication possibility, such as, for example, a deposition or the like, is also conceivable.

Contact is made with the base zones 13 and the emitter zones 14, 15 through conventional contacts 17, 18, 19 on the wafer surface 12. The first contact electrodes 17 of the first emitter zones 14 are respectively connected to the second busbar 3 and, thus, to the reference ground. The second and third contact electrodes 18, 19 of the first emitter zone 14 and of the connection zone 16 are each connected to the terminal pad 5.

Also shown in FIG. 2 is a buffer zone 20 that extends from the wafer front side 12 through the entire epitaxial layer 10 down into the semiconductor body 7. In the example, the buffer zone 20 is p-doped silicon. However, the buffer zone 20 may also be formed by any other conventional buffer material, for example, silicon dioxide, silicon nitride, or the like. The buffer zone 20 usually has the function of shielding or isolating the ESD protective structures from the integrated semiconductor circuit 1 or the semiconductor chip. It is particularly advantageous, however, if the buffer zone 20 is composed of p+-doped silicon, where it is possible to utilize the forward-biased pn diode between buried layer 11 and p-doped substrate 7 in order to dissipate negative pulses, for example. These negative pulses can then be conducted away through the p+-doped buffer zone 20.

FIG. 2 diagrammatically illustrates the equivalent circuit diagram of the ESD protective structure according to the invention in the cross section through the semiconductor body 7. The ESD protective structure includes two switching transistors T1 and two driving transistors T2. In the example, the switching transistors are npn bipolar transistors whose emitter, base, and collector are formed by the first emitter zones 14, the base zones 13, and the buried layer 11. The driving transistors T2 are pnp bipolar transistors whose emitter, base, and collector are formed by the second emitter zones 15, the buried layer 11, and the base zones 13.

The collector terminals and base terminals of the switching transistors T1 and the driving transistors T2 are connected to form a thyristor structure by reciprocal coupling. The driving transistors control the switching transistors in the on or off state.

The buried layer 11, which is connected respectively to the collector terminals of the switching transistors T1 and to the base terminals of the driving transistors T2, contains respective first resistors R1. The first resistors R1 are defined by the conductance in the buried layer 11.

On the collector side, second resistors R2 are provided between the switching transistors T1 and the terminal pad 5. The second resistors R2 are defined by the conductance of the connection zones 16 and also by contact resistances.

Typically, the lateral cross-sectional area of the buried layer 11 is at least larger than the cross-sectional area enclosed by the ring structure of the connection zone 16. For practical reasons, the ring-shaped connection zone 16 and the buried layer 11 have a square or rectangular configuration. However, it is also advantageous if these zones 11, 16 are circular or round. In the latter case, the base zones 13 and emitter zones 14, 15 are not formed as fingers but are configured as annuli, for example.

The method of operation of the ESD protective structure according to the invention will be explained in more detail below.

If an interference signal is coupled in through the terminal pad 5, and if the interference signal exceeds the switching threshold of the driving transistors T2, then the space charge zone at the pn junction of the driving transistors T2, which are connected in a diode connection, breaks down. The driving transistors T2 turn on. As a result, the base of the switching transistors T1 is driven such that the latter are switched on in the event of a sufficiently high driving current. Consequently, a current path is produced from the terminal pad 5 through the connection zones 16, the buried layer 11, the base zones 13, to the emitter zones 14 and, consequently, to the second busbar 3. Consequently, the interference signal is conducted away onto the second busbar 3 and, thus, does not pass into the integrated semiconductor circuit 1.

ESD protective elements that are based on vertical npn bipolar transistors and whose p-type bases are driven by integrated pnp bipolar transistors (e.g. in the case of a two-finger structure), exhibit a failure threshold that is 50% higher than in an open-base configuration. The failure is explained as follows: a local breakdown occurs in the vertical npn transistor, which is represented by the switching transistors T1. Due to the voltage drop across the connection regions 16 and contacts of the buried layer 11, and, thus, of the base regions of the lateral pnp transistors (driving transistors T2), the lateral pnp transistors are driven. Due to the high conductance of the buried layer 11, driving is uniform over the entire width of the driving transistors T2. As a result, the remaining local switching transistors T1 are also turned on.

In the course of dimensioning the driving transistors T2, care must be taken to ensure there can be no triggering of a local thyristor with correspondingly inhomogeneous current distribution and, for the circuit properties, unsuitable snapback of the characteristic curve down to a very low sustaining voltage typically of about 1.4V.

Figure 4:
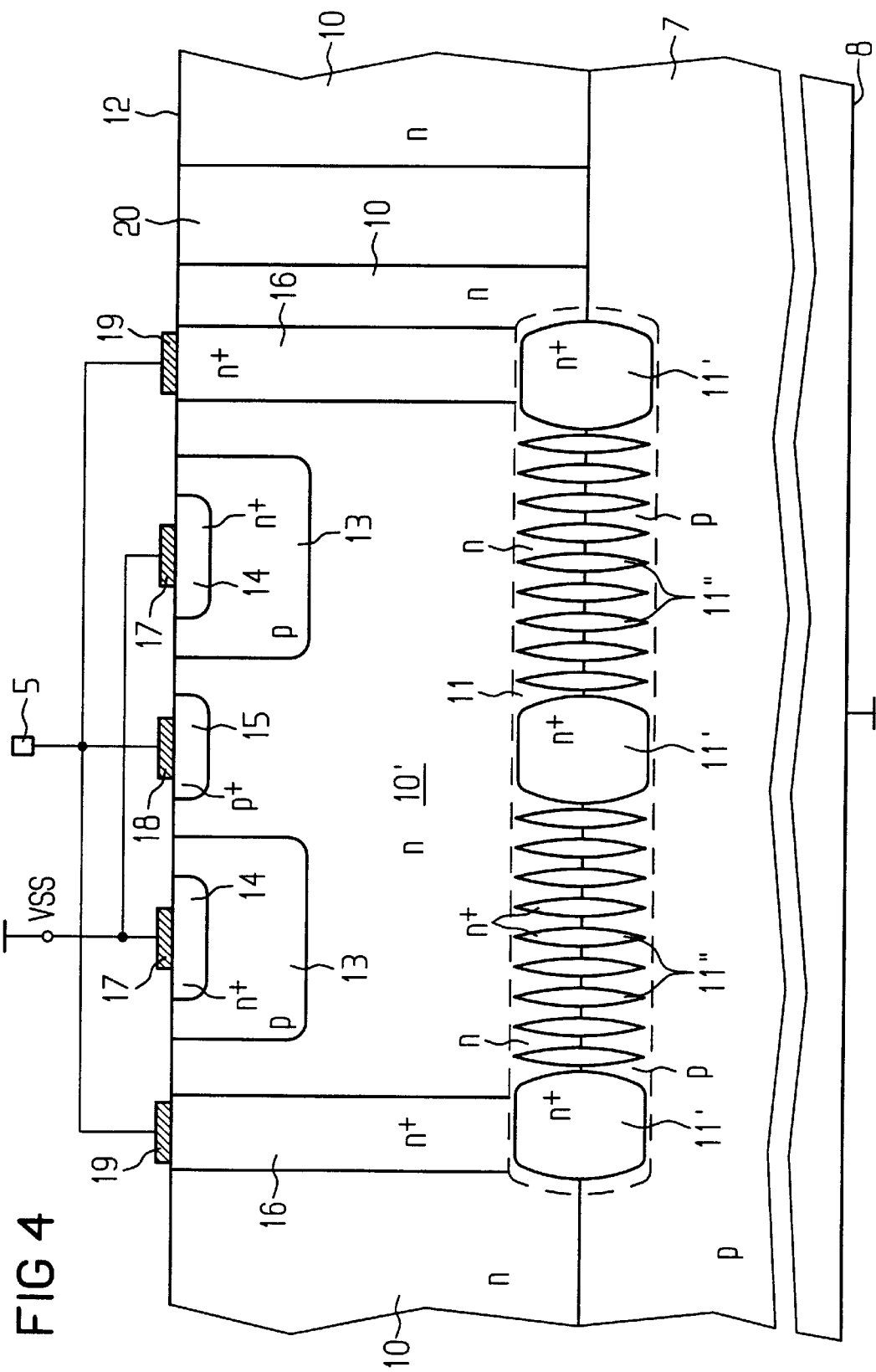
FIG. 4 is a partial cross-sectional view through a third exemplary embodiment of an ESD protective structure according to the invention.

FIGS. 3 and 4 show two further exemplary embodiments of an ESD protective structure according to the invention. To improve clarity, an illustration of the equivalent circuit diagram has been dispensed with in FIGS. 3 and 4.

The ESD protective structures of FIGS. 3 and 4 essentially have the same construction as the ESD protective structure of FIG. 2. The essential difference of the ESD protective structures in FIGS. 3 and 4 resides in the configuration of the buried layer 11.

In FIG. 3, the buried layer 11 has a multiplicity of homogeneously n+-doped partial regions 11'. The remaining regions of the buried layer 11 that are not occupied by the partial regions 11' typically have the doping of the semiconductor body 7 or of the epitaxial layer 10.

The buried layer 11 in FIG. 4 also has n+-doped partial regions 11'. The partial regions 11' are on one hand vertically disposed under the second emitter zone 15, and, on the other hand, the partial regions 11' make contact with the connection zones 16. Further partial regions 11" are disposed between the partial regions 11' in the buried layer 11. The further partial regions 11" are configured to be significantly smaller than the partial regions 11'. The partial regions 11" may be configured as strips, spherically, etc.

Partial regions 11' in FIG. 3 are typically, but not necessarily, spaced apart from one another after their fabrication. Similarly, the partial regions 11' and further partial regions 11" in FIG. 4 are typically, but not necessarily, spaced apart from one another after their fabrication. The partial regions 11' and further partial regions 11" can be produced by ion implantation or by diffusion. To achieve an at least locally homogenous doping concentration in the buried layer 11, the fabrication of the partial regions 11' and further partial regions 11" is typically followed by a heat-treatment step. Due to the heat-treatment step, an at least locally homogeneous doping concentration is obtained in the buried layer 11. As such, the partial regions 11' typically have a higher doping concentration than the further partial regions 11".

As a result of providing an ESD protective structure in accordance with FIGS. 3 and 4, the first transistor T1 is constructed such that the buried layer 11 is configured as structured implantation to obtain a suitable setting of the doping concentration in the buried layer 11 without an additional process step. Because the thickness of the epitaxial layer 10 is typically selected such that the space charge zone formed between base and collector of the first transistor T1 is bounded by the buried layer 11, a higher breakdown voltage or else a higher sustaining voltage can be obtained by virtue of a lower doping concentration in the buried layer 11.

Uniform driving of the second transistor T2 is essential to the homogeneous activation of the first transistor T1. However, the uniformity requires the base terminal of the second transistor T2 to be configured with a low resistance in vertical projection. The configuration can be achieved by the structuring—according to the invention—of the buried layer 11 by the partial regions 11' and further partial regions 11" (see FIGS. 3 and 4). The structuring makes it possible to achieve a higher sustaining voltage compared with identical ESD protective structures (with a comparable ESD strength) that do not have the structuring in the buried layer 11. The ESD protective structures in accordance with FIGS. 3 and 4 thus permit improved adjustability of the sustaining voltage.

FIG. 5 shows a plan view of the finger structure in accordance with FIG. 2. In order to provide a better overview, the electrodes 17, 18, 19 and the connecting lines are not illustrated.

The finger structure in FIG. 5 includes three base zones 13. First emitter zones 14 are disposed centrally in each of the three base zones 13. Second emitter zones 15 are disposed equidistantly between respective neighboring base zones 13. The distance between base zones 13 and second emitter zones 15 is given by the first distance d1. The second distance d2 describes the distance between the base zones 13 or second emitter zones 15 and the connection zone 16. The connection zone 16 encloses the base zones 13 and emitter zones 14, 15 in the shape of a ring. The ring-shaped region defines the partial region 10'.

A broken line in FIG. 5 indicates the position of the buried layer 11. As indicated, the lateral cross-sectional area of the buried layer 11 must be at least as large as the lateral cross-sectional area enclosed by the ring-shaped connection zone 16.

As shown in FIG. 5, the ring-shaped connection zone 16 and, thus, also the partial region 10' that makes up the finger structure are of rectangular configuration. To obtain a homogeneous distribution of the electric field, it is advantageous for the connection region 16, the buried layer 11 and also the base zones 13 and emitter zones 14, 15 of the finger structure to be rounded at their edges or corners.

The invention is particularly advantageous for use of the ESD protective element in a microcontroller, in a semiconductor memory, or in a logic component. The integrated semiconductor circuit, and also the associated ESD protective element, are preferably realized in bipolar form or are fabricated using smart power technology. However, it is also particularly advantageous if the integrated semiconductor circuit 1 and also the ESD protective circuit are fabricated using CMOS technology.

I claim:

1. In a semiconductor assembly having at least one semiconductor body, an integrated semiconductor circuit disposed in the at least one semiconductor body, an electrically conductive connecting line, at least one terminal pad connected to the integrated semiconductor circuit through the connecting line, at least one first busbar carrying a first supply potential of the integrated semiconductor circuit during operation, at least one second busbar carrying a second supply potential of the integrated semiconductor circuit during operation, and a protector for protecting the integrated semiconductor circuit against electrostatic discharge, the protector disposed between the at least one terminal pad and the integrated semiconductor circuit and connected to one of the at least one first busbar and the at least one second busbar, the protector comprising:
   a partial region having:
      at least one base zone;
      at least one first emitter zone; and
      at least one second emitter zone; and
   at least one protective element disposed in said partial region, said at least one protective element having:
      switching transistors each having a base terminal, a collector terminal, an emitter terminal, and majority charge carriers of a first conduction type;
      driving transistors each having a base terminal, a collector terminal, an emitter terminal, and majority charge carriers of a second conduction type, said switching transistors and said driving transistors respectively connected by coupling of at least one of said base terminals and said collector terminals to form a thyristor structure;
      at least one first integrated resistor with a resistance connected to said base terminals of said driving transistors and said collector terminals of said switching transistors; and
      a buried layer having partial regions with a higher doping concentration than regions of said buried layer outside said partial regions;
   said at least one base zone being a well having said first conduction type and forming said base terminals of said switching transistors and said collector terminals of said driving transistors;
   said at least one first emitter zone being a second well having said second conduction type, being disposed in said at least one base zone, and forming said emitter terminals of every one of said switching transistors; and
   said at least one second emitter zone being a third well having said first conduction type, being spaced apart from said at least one base zone by a first distance, and forming said emitter terminals of said driving transistors.

2. The protector according to claim 1, wherein said partial regions are disposed next to one another and spaced apart from one another in said buried layer.

3. The protector according to claim 1, wherein said partial regions are disposed next to one another in said buried layer.

4. The protector according to claim 1, wherein said partial regions are disposed spaced apart from one another in said buried layer.

5. The protector according to claim 1, wherein said buried layer is at least one buried layer, and said at least one buried layer:
   has said second conduction type and said first integrated resistor;
   forms said collector terminals of said switching transistors; and
   forms said base terminals of said driving transistors.

6. The protector according to claim 5, wherein said at least one buried layer has a doping concentration, and a conductance of said first integrated resistor is defined by said doping concentration of said at least one buried layer.

7. The protector according to claim 1, wherein said driving transistors drive said switching transistors.

8. The protector according to claim 7, wherein said switching transistors have a base-collector gain, and said driving transistors have a base-collector gain less than said base-collector gain of said switching transistors.

9. The protector according to claim 1, wherein said driving transistors have a base-collector gain defined by said first distance.

10. The protector according to claim 1, including at least one connection zone connected to said buried layer and to at least one of the at least one first busbar and the at least one second busbar.

11. The protector according to claim 10, wherein said at least one connection zone has a doping concentration, and a second integrated resistor has a conductance set by said doping concentration of said at least one connection zone.

12. The protector according to claim 10, wherein said at least one connection zone is a closed ring around said partial region.

13. The protector according to claim 10, wherein said at least one connection zone and said partial region define a given lateral cross-sectional area, and said buried layer has a lateral cross-sectional area larger than said given lateral cross-sectional area.

14. The protector according to claim 1, including connection zones equidistantly spaced from at least one of said at least one base zone and said at least one second emitter zone by a second distance, and connected to said buried layer and to at least one of the at least one first busbar and the at least one second busbar.

15. The protector according to claim 14, wherein said connection zones have a doping concentration, and a second integrated resistor having a conductance set by said doping concentration of said connection zones.

16. The protector according to claim 14, wherein said connection zones form a closed ring around said further partial region.

17. The protector according to claim 14, wherein said connection zones and said further partial region define a given lateral cross-sectional area, and said buried layer has a lateral cross-sectional area larger than said given lateral cross-sectional area.

18. The protector according to claim 1, wherein the semiconductor body has an epitaxial layer and said partial region is in the epitaxial layer of the semiconductor body.

19. The protector according to claim 1, wherein said at least one first emitter zone has a higher doping concentration than said at least one base zone.

20. The protector according to claim 1, wherein said buried layer has a doping concentration greater than $1*10^{19}$ $cm^{-3}$.

* * * * *